(12) United States Patent
Rahman et al.

(10) Patent No.: US 8,906,590 B2
(45) Date of Patent: Dec. 9, 2014

(54) ANTIREFLECTIVE COATING COMPOSITION AND PROCESS THEREOF

(75) Inventors: Dalil M Rahman, Flemington, NJ (US); Douglas McKenzie, Easton, PA (US); Jianhui Shan, Pennington, NJ (US); JoonYeon Cho, Bridgewater, NJ (US); Salem K. Mullen, Florham Park, NJ (US); Clement Anyadiegwu, Parlin, NJ (US)

(73) Assignee: AZ Electronic Materials USA Corp., Somerville, NJ (US)

( * ) Notice: Subject to any disclaimer, the term of this patent is extended or adjusted under 35 U.S.C. 154(b) by 45 days.

(21) Appl. No.: 13/351,681

(22) Filed: Jan. 17, 2012

(65) Prior Publication Data

US 2012/0251956 A1    Oct. 4, 2012

Related U.S. Application Data

(63) Continuation-in-part of application No. 13/075,749, filed on Mar. 30, 2011, now abandoned.

(51) Int. Cl.
*G03F 7/004* (2006.01)
*G03F 7/30* (2006.01)

(52) U.S. Cl.
USPC ............. 430/270.1; 430/271.1; 430/913; 430/927

(58) Field of Classification Search
USPC ............ 430/270.1, 271.1, 913, 927
IPC ........... G03F 7/091,1/46; Y10S 430/128; H01L 21/0276; C09D 165/00; C08G 61/02, 2261/3424
See application file for complete search history.

(56) References Cited

U.S. PATENT DOCUMENTS

| | | |
|---|---|---|
| 3,474,054 A | 10/1969 | White |
| 4,200,729 A | 4/1980 | Calbo |

(Continued)

FOREIGN PATENT DOCUMENTS

| | | |
|---|---|---|
| EP | 1 088 875 A2 | 4/2001 |
| EP | 1995636 A1 * | 11/2008 |

(Continued)

OTHER PUBLICATIONS

Machine translation of JP 08-301980 (no date).*

(Continued)

*Primary Examiner* — Amanda C. Walke
(74) *Attorney, Agent, or Firm* — Sangya Jain

(57) ABSTRACT

The invention relates to an antireflective coating composition comprising a crosslinker and a crosslinkable polymer capable of being crosslinked by the crosslinker, where the crosslinkable polymer comprises a unit represented by structure (1):

$$\mathrm{+\!-\!A\text{-}B\text{-}C\text{-}\!+}\qquad(1)$$

where A is a fused aromatic ring, B has a structure (2), and C is a hydroxybiphenyl of structure (3)

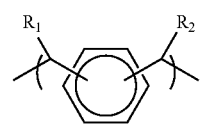

(2)

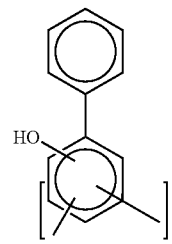

(3)

where $R_1$ is $C_1$-$C_4$alkyl and $R_2$ is $C_1$-$C_4$alkyl.
The invention further relates to a process for forming an image using the composition.

20 Claims, 1 Drawing Sheet

Imaging Process of a Trilayer

(56) References Cited

U.S. PATENT DOCUMENTS

| | | | |
|---|---|---|---|
| 4,251,665 A | | 2/1981 | Calbo |
| 4,491,628 A | | 1/1985 | Ito et al. |
| 5,187,019 A | | 2/1993 | Calbo et al. |
| 5,350,660 A | | 9/1994 | Urano et al. |
| 5,629,355 A | * | 5/1997 | Kuczynski .................. 522/31 |
| 5,843,624 A | | 12/1998 | Houlihan et al. |
| 6,447,980 B1 | | 9/2002 | Rahman et al. |
| 6,723,488 B2 | | 4/2004 | Kudo et al. |
| 6,790,587 B1 | | 9/2004 | Feiring et al. |
| 6,818,258 B2 | | 11/2004 | Kaneko et al. |
| 6,849,377 B2 | | 2/2005 | Feiring et al. |
| 6,866,984 B2 | | 3/2005 | Jung et al. |
| 6,916,590 B2 | | 7/2005 | Kaneko et al. |
| 7,060,410 B2 | * | 6/2006 | Ohnishi et al. .................. 430/189 |
| 7,405,029 B2 | | 7/2008 | Oh et al. |
| 7,632,622 B2 | | 12/2009 | Uh et al. |
| 7,691,556 B2 | | 4/2010 | Wu et al. |
| 7,754,414 B2 | * | 7/2010 | Oberlander .................. 430/270.1 |
| 7,932,018 B2 | | 4/2011 | McKenzie et al. |
| 7,989,144 B2 | | 8/2011 | Rahman et al. |
| 8,017,296 B2 | * | 9/2011 | Houlihan et al. .......... 430/270.1 |
| 8,445,187 B2 | | 5/2013 | Yoon et al. |
| 8,465,902 B2 | * | 6/2013 | Yao et al. .................. 430/270.1 |
| 8,486,609 B2 | * | 7/2013 | Rahman et al. ............... 430/311 |
| 2004/0181909 A1 | * | 9/2004 | Kawamoto ..................... 16/330 |
| 2005/0058929 A1 | * | 3/2005 | Kennedy et al. ........... 430/270.1 |
| 2006/0234158 A1 | * | 10/2006 | Hatakeyama ............. 430/270.1 |
| 2006/0251990 A1 | | 11/2006 | Uh et al. |
| 2007/0059635 A1 | | 3/2007 | Oh et al. |
| 2007/0148586 A1 | | 6/2007 | Uh et al. |
| 2008/0005441 A1 | | 1/2008 | Droux et al. |
| 2008/0153033 A1 | | 6/2008 | Hyung et al. |
| 2008/0160460 A1 | | 7/2008 | Yoon et al. |
| 2008/0160461 A1 | | 7/2008 | Yoon et al. |
| 2008/0292987 A1 | | 11/2008 | Houlihan et al. |
| 2008/0292995 A1 | * | 11/2008 | Houlihan et al. ............. 430/322 |
| 2009/0176165 A1 | | 7/2009 | Cheon et al. |
| 2010/0021830 A1 | | 1/2010 | Kim et al. |
| 2010/0119979 A1 | | 5/2010 | Rahman et al. |
| 2010/0119980 A1 | | 5/2010 | Rahman et al. |
| 2010/0151392 A1 | * | 6/2010 | Rahman et al. ............... 430/313 |
| 2010/0316949 A1 | | 12/2010 | Rahman et al. |
| 2010/0316950 A1 | * | 12/2010 | Oguro et al. ................ 430/270.1 |
| 2011/0151376 A1 | | 6/2011 | Rahman et al. |
| 2011/0178252 A1 | * | 7/2011 | Sung et al. .................... 525/482 |
| 2012/0153424 A1 | | 6/2012 | Oh et al. |
| 2012/0168894 A1 | | 7/2012 | Kim et al. |
| 2012/0181251 A1 | | 7/2012 | Minegishi et al. |
| 2012/0251943 A1 | | 10/2012 | Rahman et al. |
| 2012/0252218 A1 | | 10/2012 | Kori et al. |
| 2012/0326140 A1 | | 12/2012 | Fukushima et al. |
| 2013/0158165 A1 | * | 6/2013 | Han et al. ...................... 523/452 |
| 2014/0038109 A1 | | 2/2014 | Rahman et al. |

FOREIGN PATENT DOCUMENTS

| | | | |
|---|---|---|---|
| JP | 08301980 A | * | 11/1996 |
| JP | 2005-19055 A | | 1/2005 |
| JP | 2009014816 A | * | 1/2009 |
| JP | 2010-271654 A | | 12/2010 |
| JP | 2012-207007 A | | 10/2012 |
| KR | 10-2010-0072660 A | | 7/2010 |
| WO | WO 2008/142546 A2 | | 11/2008 |

OTHER PUBLICATIONS

Machine translation of JP2009-014816 (no date).*
English Language Abstract from Espacenet of KR 10-2010-0072660 A (no date).
Form PCT/ISA/220, IForm PCT/ISA/210, and Form PCT/ISA/237 for PCT/IB2012/000632 dated Jun. 19, 2012, which corresponds to U.S. Appl. No. 13/351,681.
Form PCT/IB/326, Form PCT/IB/373, and Form PCT/ISA/237 dated Oct. 10, 2013 for PCT/IB2012/000632, which corresponds to U.S. Appl. No. 13/075,749.
Office Action mail date Jun. 13, 2014 for U.S. Appl. No. 13/563,877.

* cited by examiner

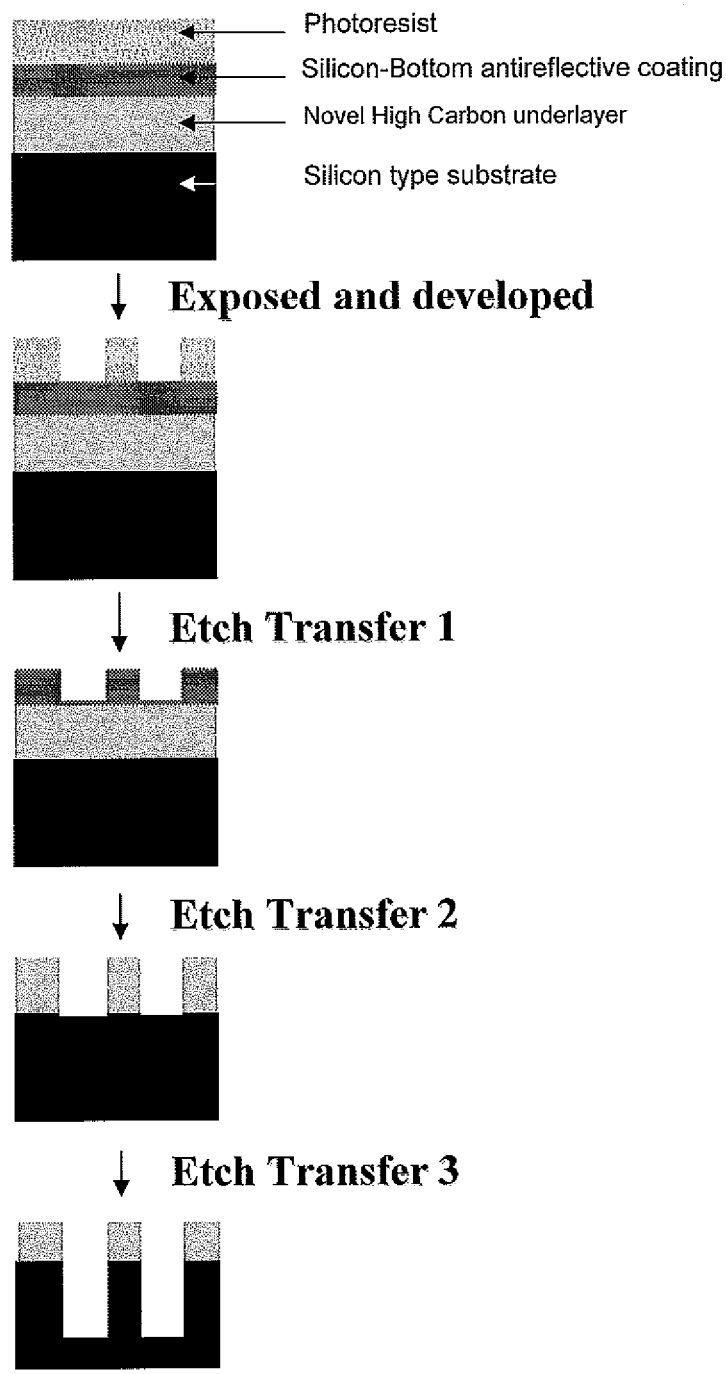
Imaging Process of a Trilayer

ANTIREFLECTIVE COATING COMPOSITION AND PROCESS THEREOF

CROSS-REFERENCE TO RELATED APPLICATION

This application is a continuation-in-part application of Ser. No. 13/075,749 filed Mar. 30, 2011 the contents of which are hereby incorporated herein by reference.

The present invention relates to an absorbing hard mask antireflective coating composition comprising a polymer, where the polymer comprises in the backbone of the polymer at least one phenyl unit, at least one hydroxybiphenyl unit, and at least one substituted or unsubstituted fused aromatic ring, and a process for forming an image using the antireflective coating composition. The process is especially useful for imaging photoresists using radiation in the deep and extreme ultraviolet (uv) region.

Photoresist compositions are used in microlithography processes for making miniaturized electronic components such as in the fabrication of computer chips and integrated circuits. Generally, in these processes, a thin coating of film of a photoresist composition is first applied to a substrate material, such as silicon based wafers used for making integrated circuits. The coated substrate is then baked to evaporate any solvent in the photoresist composition and to fix the coating onto the substrate. The baked coated surface of the substrate is next subjected to an image-wise exposure to radiation.

This radiation exposure causes a chemical transformation in the exposed areas of the coated surface. Visible light, ultraviolet (UV) light, electron beam and X-ray radiant energy are radiation types commonly used today in microlithographic processes. After this image-wise exposure, the coated substrate is treated with a developer solution to dissolve and remove either the radiation-exposed or the unexposed areas of the photoresist.

The trend towards the miniaturization of semiconductor devices has led to the use of new photoresists that are sensitive to lower and lower wavelengths of radiation and has also led to the use of sophisticated multilevel systems to overcome difficulties associated with such miniaturization.

Absorbing antireflective coatings and underlayers in photolithography are used to diminish problems that result from back reflection of light from highly reflective substrates. Two major disadvantages of back reflectivity are thin film interference effects and reflective notching. Thin film interference, or standing waves, result in changes in critical line width dimensions caused by variations in the total light intensity in the photoresist film as the thickness of the photoresist changes or interference of reflected and incident exposure radiation can cause standing wave effects that distort the uniformity of the radiation through the thickness. Reflective notching becomes severe as the photoresist is patterned over reflective substrates containing topographical features, which scatter light through the photoresist film, leading to line width variations, and in the extreme case, forming regions with complete photoresist loss. An antireflective coating coated beneath a photoresist and above a reflective substrate provides significant improvement in lithographic performance of the photoresist. Typically, the bottom antireflective coating is applied on the substrate and then a layer of photoresist is applied on top of the antireflective coating. The antireflective coating is cured to prevent intermixing between the antireflective coating and the photoresist. The photoresist is exposed imagewise and developed. The antireflective coating in the exposed area is then typically dry etched using various etching gases, and the photoresist pattern is thus transferred to the substrate. Multiple antireflective layers and underlayers are being used in new lithographic techniques. In cases where the photoresist does not provide sufficient dry etch resistance, underlayers or antireflective coatings for the photoresist that act as a hard mask and are highly etch resistant during substrate etching are preferred, and one approach has been to incorporate silicon into a layer beneath the organic photoresist layer. Additionally, another high carbon content antireflective or mask layer is added beneath the silicon antireflective layer, which is used to improve the lithographic performance of the imaging process. The silicon layer may be spin coatable or deposited by chemical vapor deposition. Silicon is highly etch resistant in processes where $O_2$ etching is used, and by providing a organic mask layer with high carbon content beneath the silicon antireflective layer, a very large aspect ratio can be obtained. Thus, the organic high carbon mask layer can be much thicker than the photoresist or silicon layer above it. The organic mask layer can be used as a thicker film and can provide better substrate etch masking that the original photoresist.

The present invention relates to a novel organic spin coatable antireflective coating composition or organic mask underlayer which has high carbon content, and can be used between a photoresist layer and the substrate as a single layer of one of multiple layers. Typically, the novel composition can be used to form a layer beneath an essentially etch resistant antireflective coating layer, such as a silicon antireflective coating. The high carbon content in the novel antireflective coating, also known as a carbon hard mask underlayer, allows for a high resolution image transfer with high aspect ratio. The novel composition is useful for imaging photoresists, and also for etching the substrate. The novel composition enables a good image transfer from the photoresist to the substrate, and also reduces reflections and enhances pattern transfer. Additionally, substantially no intermixing is present between the antireflective coating and the film coated above it. The antireflective coating also has good solution stability and forms films with good coating quality, the latter being particularly advantageous for lithography.

SUMMARY OF THE INVENTION

The invention relates to an antireflective coating composition comprising a crosslinker and a crosslinkable polymer, where the crosslinkable polymer comprises a unit represented by structure (1):

where A is a fused aromatic ring, B has a structure (2), and C is a hydroxybiphenyl of structure (3)

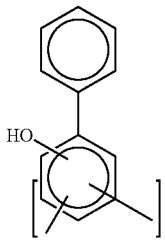

(3)

where $R_1$ is $C_1$-$C_4$alkyl and $R_2$ is $C_1$-$C_4$alkyl.

The invention further relates to a process for forming an image using the composition.

BRIEF DESCRIPTION OF DRAWINGS

FIG. 1 illustrates a process of imaging.

DETAILED DESCRIPTION OF THE INVENTION

The present invention relates to an absorbing antireflective coating composition comprising a crosslinker and a crosslinkable polymer capable of being crosslinked with the crosslinker, where the polymer comprises at least one unit with a phenyl group in the backbone of the polymer, at least one fused aromatic unit in the backbone of the polymer, and at least one hydroxybiphenyl unit. The invention also relates to a process for imaging a photoresist layer coated above the novel antireflective coating layer.

The novel antireflective composition of the present invention comprises a novel polymer with high carbon content which is capable of crosslinking, such that the coating, formed from the composition after crosslinking, becomes insoluble in the solvent of the material coated above it. The novel coating composition is capable of self-crosslinking or may additionally comprise a crosslinking compound capable of crosslinking with the polymer. The composition may additionally comprise other additives, such as organic acids, esters, thermal acid generators, photoacid generators, surfactants, other high carbon content polymers etc. The composition may comprise additional polymers, especially those with high carbon content. The solid components of the novel composition are dissolved in an organic coating solvent composition, comprising one or more organic solvents. The novel polymer is soluble in the organic coating solvent(s).

The polymer of the novel composition comprises at least one unit of fused aromatic moiety, at least one unit with a phenyl moiety in the backbone of the polymer, and at least one hydroxybiphenyl unit. The polymer may be represented by structure 1,

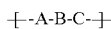

(1)

where A is a fused aromatic ring moiety, B has a structure (2), and C, the hydroxyphenyl unit, is represented by structure (3),

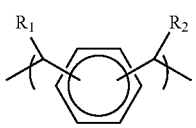

(2)

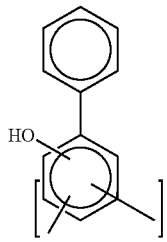

(3)

where $R_1$ is $C_1$-$C_4$alkyl and $R_2$ is $C_1$-$C_4$alkyl. The fused aromatic unit, A, may be represented by structure (4),

(4)

The fused aromatic moiety comprises 2 or more aromatic units fused together. The fused aromatic moiety may comprise 2-8 aromatic rings or 2-6 aromatic rings or 3-5 aromatic rings or 3-4 aromatic rings. The fused aromatic ring may comprise 3 aromatic rings. The fused aromatic ring may be naphthylene, anthracene, pyrene, etc. The fused aromatic ring may be anthracyl. The polymer may further comprise an additional unit, D, which is fused aromatic unit of structure (5) attached only through its aromatic moiety to form the backbone of the polymer,

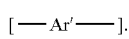

(5)

Ar' may comprise 2-8 fused aromatic rings.

The novel polymer may be obtained by a condensation reaction of a monomer (I) comprising a fused aromatic group with a methylene group, a monomer (II) comprising a phenyl moiety with 2 attached vinyl groups and a monomer (III) with a hydroxybiphenyl moiety, in the presence of an acid catalyst. The reaction may further comprise a fused aromatic compound (IV). As an example, the monomer (II) may be divinylbenzene; the compound (I) may be anthracene methanol such as 9-anthracene methanol; the compound (III) may be 2-phenylphenol; and, the compound (IV) may be naphthalene, anthracene or pyrene. The compound (I) may also be derived from ArCH$_2$X, where Ar is the fused aromatic moiety, and X is a leaving group, such as OH, Cl, I, Br, carboxylate, sulfonate, etc; examples of compound (I) are anthracenemethanol, phenanthrenemethanol, pyrenemethanol, fluoranthenemethanol, coronenemethanol, triphenylenemethanol, anthracene-9-methanol, anthracene methylmethoxy, etc. The fused aromatic rings provides reactive sites which are sites for electrophilic substitution. The biphenyl unit substituted with OH may be chosen from compounds (III) such as 2-phenylphenol, 3-phenylphenol, 4-phenylphenol, 2-(3-hydroxyphenyl)phenol, 2-(2-hydroxyphenyl)phenol and the like such that at least two sites are available for electrophilic attack.

The fused aromatic moiety, Ar', in the polymer comprises fused aromatic rings, which are substituted or unsubstituted, but different from unit A. The fused aromatic rings of the polymer can comprise 2 to 8 membered aromatic rings. Examples of the fused aromatic moiety are the following structures 6-17.

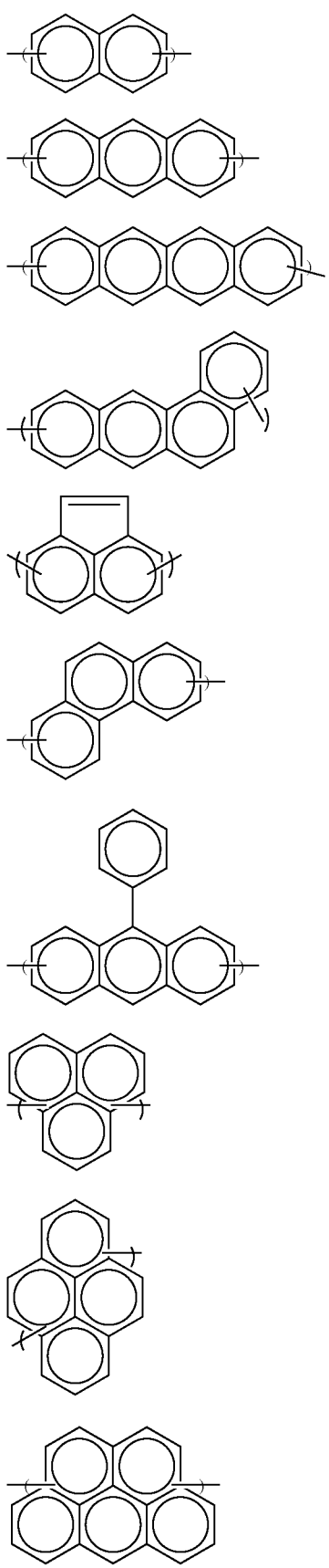

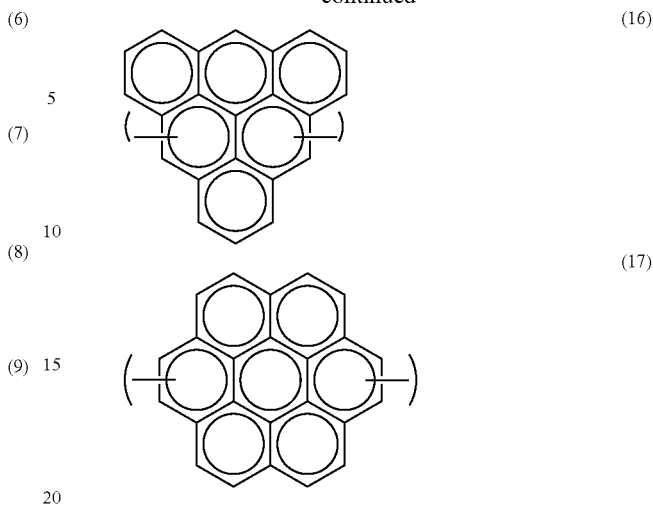

Although the unit may be as shown in structures 6-17, the fused rings may form the backbone of the polymer at any site in the aromatic structure and the attachment sites may vary within the polymer. The fused ring structure can have more than 2 points of attachment forming a branched oligomer or branched polymer. In one embodiment of the polymer, the fused aromatic unit is connected to another aromatic carbon moiety or another fused aromatic unit. Blocks of fused aromatic units may be formed and the blocks may be separated by a saturated aliphatic carbon unit, such as methylene.

The fused aromatic rings of the polymer may be unsubstituted or substituted with one or more organo constituents, such as alkyl, substituted alkyl, aryl, substituted aryl, alkylaryl, and haloalkyls, hydroxyl, amino, aminoalkyl, alkoxy, such as methyl, aminomethyl, bromomethyl, and chloromethyl group. Up to 4 substituents may be present. The substituents on the aromatic rings may aid in the solubility of the polymer in the coating solvent. Some of the substituents on the fused aromatic structure may also be thermolysed during curing, such that they may not remain in the cured coating and thus give a high carbon content film useful during the etching process.

The polymer may comprise more than one type of the fused aromatic structures described herein. In one embodiment the fused aromatic moiety is unsubstituted. In one embodiment the fused aromatic moiety is free of hydroxy or alkoxy groups. In another embodiment the fused aromatic moiety of A and the phenyl group of B is unsubstituted, that is substituted only with hydrogen. In another embodiment A is anthracenemethylene, B is methylenebenzenemethylene and C is hydroxybiphenyl; D when present is naphthalene or anthracene.

The novel polymer may comprise the following units,

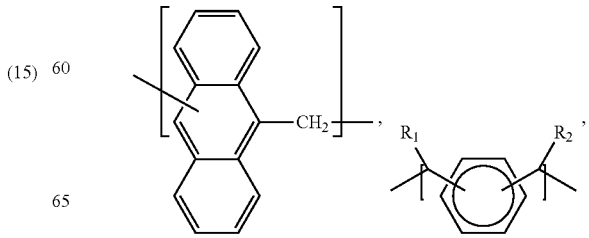

-continued

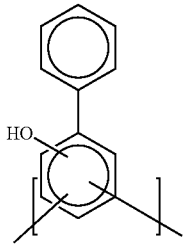

where $R_1$ is $C_1$-$C_4$alkyl and $R_2$ is $C_1$-$C_4$alkyl. In one embodiment $R_1$ and $R_2$ are hydrogen or methyl. In addition to the fused ring unit, the polymer of the novel antireflective coating further comprises at least one unit, B, shown in structure (2) which comprises a phenyl group. The unit B may be derived from a monomer comprising 2 unsaturated groups, such as alkyl substituted or unsubstituted divinyl benzene. The polymer comprise units, -(A)-, -(B)- and -(C)-, where A is any fused aromatic unit described previously, which may be linear or branched, substituted or unsubstituted, where B is phenyl group which is connected to A through a saturated carbon, as shown in structure 2, and C is the hydroxybiphenyl unit.

In one embodiment, fused aromatic monomers with 4 or more fused aromatic rings such as pyrene or higher, which have a lesser amount of hydrogen relative to carbon than those with 3 or less fused aromatic monomers, are advantageous when used in the polymers of this invention as they can increase the carbon content of these polymers and also decrease their hydrogen content, which in turns results in polymers with improved plasma etch resistance. Additionally, the incorporation of pyrene into these novel polymers unexpectedly also allows these polymers to be oxidized at relatively low bake temperatures, thus further reducing hydrogen content resulting in less tendency for patterns etched into this material to undergo swelling (pattern distortion) in plasmas containing fluorinated compound (eg $CF_4$, HF and the like). Although, not being bound by theory, the distortion maybe due to the replacement of smaller atoms of hydrogen with larger atoms of fluorine.

The equation below shows the formation of a polymer of this invention employing the high carbon, low hydrogen monomer pyrene.

Aryl or aromatic groups contain 6 to 24 carbon atoms including phenyl, tolyl, xylyl, naphthyl, anthracyl, biphenyls, bis-phenyls, tris-phenyls and the like. These aryl groups may further be substituted with any of the appropriate substituents e.g. alkyl, alkoxy, acyl or aryl groups mentioned hereinabove. Similarly, appropriate polyvalent aryl groups as desired may be used in this invention. Representative examples of divalent aryl groups include phenylenes, xylylenes, naphthylenes, biphenylenes, and the like, Alkoxy means straight or branched chain alkoxy having 1 to 20 carbon atoms, and includes, for example, methoxy, ethoxy, n-propoxy, isopropoxy, n-butoxy, isobutoxy, tert-butoxy, pentyloxy, hexyloxy, heptyloxy, octyloxy, nonanyloxy, decanyloxy, 4-methylhexyloxy, 2-propylheptyloxy, and 2-ethyloctyloxy. Aralkyl means aryl groups with attached substituents. The substituents may be any such as alkyl, alkoxy, acyl, etc. Examples of monovalent aralkyl having 7 to 24 carbon atoms include phenylmethyl, phenylethyl, diphenylmethyl, 1,1- or 1,2-diphenylethyl, 1,1-, 1,2-, 2,2-, or 1,3-diphenylpropyl, and the like. Appropriate combinations of substituted aralkyl groups as described herein having desirable valence may be used as a polyvalent aralkyl group.

In one embodiment the novel polymer is free of any aliphatic cyclic or polycyclic groups, such as cyclohexyl, adamantyl, norbornyl, etc. In another embodiment the novel polymer is free of any aliphatic cyclic or polycyclic groups, hydroxy or alkoxy group other than the one present in unit C. In one embodiment no polymer in the composition comprises an aliphatic polycyclic group, such as cyclohexyl, adamantyl, nornornyl, etc.

The polymer of the present novel composition may be synthesized by reacting a) at least one aromatic compound comprising 2 or more fused aromatic rings capable of electrophilic substitution such that the fused rings form the backbone of the polymer, with b) at least one aromatic unit with two active sites which can form carbocations, and c) at least one hydroxybiphenyl compound, in the presence of an acid catalyst. The aromatic compound may be selected from monomers that provide the desired aromatic unit, more specifically structures shown above or equivalents. Additional fused aromatic monomers may be added to the reactions

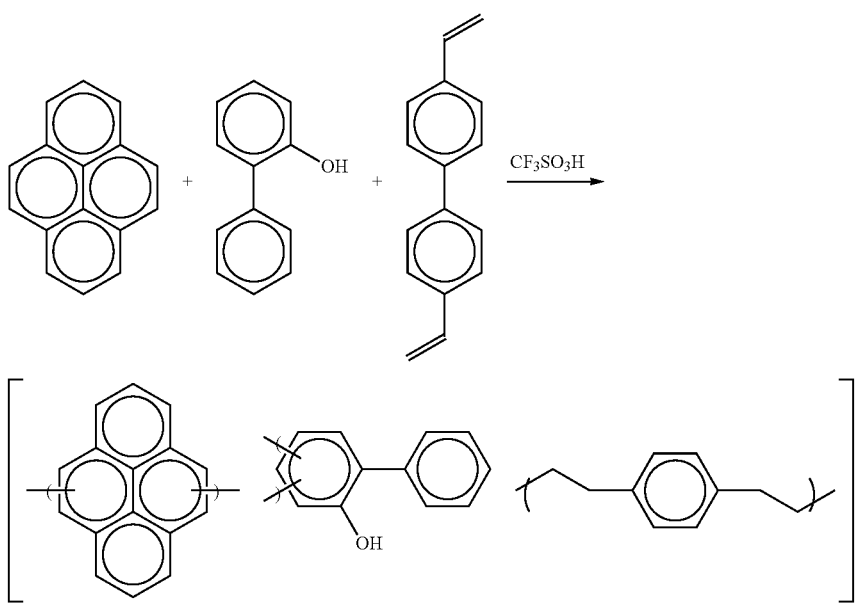

mixture and may be selected from compounds such as anthracene, phenanthrene, pyrene, fluoranthene, coronene triphenylene, etc. The fused aromatic rings provide at least 2 reactive sites which are sites for electrophilic substitution.

The monomer used to form unit B in the novel polymer comprises a phenyl unit with two reactive sites which are capable of forming carbocations in the presence of an acid, and may be selected from compounds such as divinyl benzene. The reaction is catalysed in the presence of a strong acid, such as a sulfonic acid. Any sulfonic acid may be used, examples of which are triflic acid, nonafluorobutane sulfonic acid, bisperfluoroalkylimides, trisperfluoroalkylcarbides, or other strong nonnucleophilic acids. The reaction may be carried out with or without a solvent. If a solvent is used then any solvent capable of dissolving the solid components may be used, especially one which is nonreactive towards strong repeat unit A containing a fused aromatic ring can be between 30-35 mole %, repeat unit B can be between 32.5-35 mole %, and repeat unit C can be between 32.5-35 mole % of the total amount of repeat units.

The polymer of the present novel composition may have the structural unit as shown in structure (18), where $R_1$ and $R_2$ are as previously described. In such a polymer the total amount of the repeat unit A and D derived from a fused aromatic ring be between 25 and 40 mole % of this total, monomer D can comprise up to 15% of the total amount. Of the remaining units repeat unit A should be between 37.5 and 30 mole % and repeat unit should be between 37.6 and 30 mole % of the total amount of repeat units. More preferably repeat unit B and D containing a fused aromatic ring be between 30-35 mole % of this total, monomer D can comprise up to 15% of the total amount. Repeat unit A should be between 32.5-35%, and repeat unit C between 32.5-35% of the total amount of repeat units.

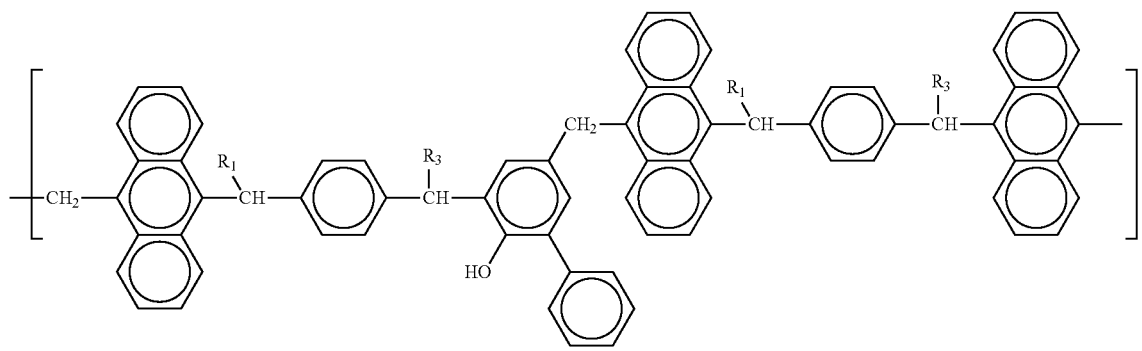

(18)

acids; solvents such as chloroform, bis(2-methoxyethyl ether), nitrobenzene, methylene chloride, and triglyme, di(ethyleneglycol)dimethylether, di(propyleneglycol)dimethylether, di(propyleneglycol)diethyl ether, propylene glycol monomethy ether acetate (PGMEA), propylene glycol monomethyl ether (PGME) may be used. The reaction may be mixed for a suitable length of time at a suitable temperature, till the polymer is formed. The reaction time may range from about 3 hours to about 24 hours, and the reaction temperature may range from about 80° C. to about 180° C. The polymer is isolated and purified in appropriate solvents, such as methanol, hexane, heptane through precipitation and washing. The novel polymer may be fractionated to obtain a fraction with the desired molecular weight. The polymer is dissolved in a solvent, for example tetrahydrofuran (THF); a nonsolvent is added to the solution such as an alkane; and a precipitate is formed and filtered. The process of fractionation may be carried out at room temperature. The polymer may be further purified. Typically the low molecular weight portion is removed. Previously known techniques of reacting, isolating and purifying the polymer may be used. The weight average molecular weight of the polymer can range from about 1200 to about 5,000, or about 1300 to about 3,000 or about 1,500 to about 2,600.

In the novel polymer the repeat unit A derived from a fused aromatic ring can be between 25 and 40 mole %, repeat unit B can be between 37.5 and 30 mole % and repeat unit C can be between 37.5 and 30 mole %. In another embodiment The refractive indices of the polymer, n (refractive index) and k (absorption) can range from about 1.3 to about 2.0 for the refractive index and about 0.04 to about 1.0 for the absorption at the exposure wavelength used, such as 193 nm, where these parameters are obtainable from an ellipsometer. The carbon content of the polymer or the composition is determined by elemental analysis of the solid composition. The carbon content of the composition or polymer can be measured after forming a coating on a substrate and drying the film. The novel polymer of the present invention retains a high carbon content even after a 400° C. bake, that is the carbon content of the polymer or composition after crosslinking is greater than 80 weight % as measured by elemental analysis, or greater than 85 weight %, or greater than weight 90%. Performing an elemental analysis on the solid coating or dry polymer provides the carbon content as weight %. The carbon content of the polymer or composition after crosslinking is greater than 80 weight % as measured by elemental analysis, or greater than 85 weight %, or greater than weight 90%. In one embodiment the carbon content of the polymer after crosslinking is in the range 80-95 weight %

The novel composition of the present invention comprises the polymer and may further comprise a crosslinker. Typically the crosslinker is a compound that can act as an electrophile and can, alone or in the presence of an acid, form a carbocation. Thus compounds containing groups such as alcohol, ether, ester, olefin, methoxymethylamino, methoxymethylphenyl and other molecules containing multiple functional groups, are capable of crosslinking with the polymer. Polymeric crosslinkers may be used, such as polymers of glycoluril, melamine, etc., such as those disclosed in U.S. Pat. No. 7,691,556. Examples of compounds which can be crosslinkers are, 1,3 adamantane diol, 1,3, 5 adamantane triol, polyfunctional reactive benzylic compounds, tetramethoxymethyl-bisphenol (TMOM-BP) of structure (18), aminoplast crosslinkers, glycolurils, Cymels, Powderlinks, etc.

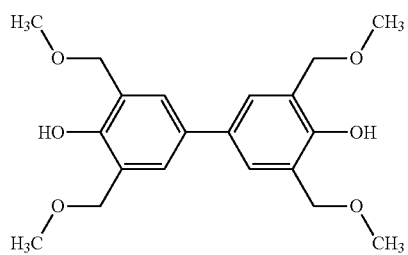

18

The novel composition comprising the polymer may also comprise an acid generator, and optionally a crosslinker. The acid generator can be a thermal acid generator capable of generating a strong acid upon heating. The thermal acid generator (TAG) used in the present invention may be any one or more that upon heating generates an acid which can react with the polymer and propagate crosslinking of the polymer present in the invention, particularly preferred is a strong acid such as a sulfonic acid. Preferably, the thermal acid generator is activated at above 90° C. and more preferably at above 120° C., and even more preferably at above 150° C. Examples of thermal acid generators are metal-free sulfonium salts and iodonium salts, such as triarylsulfonium, dialkylarylsulfonium, and diarylalkylsulfonium salts of strong non-nucleophilic acids, alkylaryliodonium, diaryliodonium salts of strong non-nucleophilic acids; and ammonium, alkylammonium, dialkylammonium, trialkylammonium, tetraalkylammonium salts of strong non nucleophilic acids. Also, covalent thermal acid generators are also envisaged as useful additives for instance 2-nitrobenzyl esters of alkyl or arylsulfonic acids and other esters of sulfonic acid which thermally decompose to give free sulfonic acids. Examples are diaryliodonium perfluoroalkylsulfonates, diaryliodonium tris(fluoroalkylsulfonyl)methide, diaryliodonium bis(fluoroalkylsulfonyl)methide, diarlyiodonium bis(fluoroalkylsulfonyl)imide, diaryliodonium quaternary ammonium perfluoroalkylsulfonate. Examples of labile esters: 2-nitrobenzyl tosylate, 2,4-dinitrobenzyl tosylate, 2,6-dinitrobenzyl tosylate, 4-nitrobenzyl tosylate; benzenesulfonates such as 2-trifluoromethyl-6-nitrobenzyl 4-chlorobenzenesulfonate, 2-trifluoromethyl-6-nitrobenzyl 4-nitro benzenesulfonate; phenolic sulfonate esters such as phenyl, 4-methoxybenzenesulfonate; quaternary ammonium tris(fluoroalkylsulfonyl)methide, and quaternaryalkyl ammonium bis(fluoroalkylsulfonyl)imide, alkyl ammonium salts of organic acids, such as triethylammonium salt of 10-camphorsulfonic acid. A variety of aromatic (anthracene, naphthalene or benzene derivatives) sulfonic acid amine salts can be employed as the TAG, including those disclosed in U.S. Pat. Nos. 3,474,054, 4,200,729, 4,251,665 and 5,187,019. Preferably the TAG will have a very low volatility at temperatures between 170-220° C. Examples of TAGs are those sold by King Industries under Nacure and CDX names. Such TAG's are Nacure 5225, and CDX-2168E, which is a dodecylbenzene sulfonic acid amine salt supplied at 25-30% activity in propylene glycol methyl ether from King Industries, Norwalk, Conn. 06852, USA.

The novel composition may further contain at least one of the known photoacid generators, examples of which without limitation, are onium salts, sulfonate compounds, nitrobenzyl esters, triazines, etc. The preferred photoacid generators are onium salts and sulfonate esters of hydoxyimides, specifically diphenyl iodonium salts, triphenyl sulfonium salts, dialkyl iodonium salts, triakylsulfonium salts, and mixtures thereof. These photoacid generators are not necessarily photolysed but are thermally decomposed to form an acid.

The antireflection coating composition of the present invention may contain 70 weight % to about 99 weight % of the novel fused aromatic polymer, and preferably 80 weight % to about 95 weight %, of total solids in the composition. The crosslinker, when used in the composition, may be present at about 1 weight % to about 30 weight % of total solids. The thermal acid generator, may be incorporated in a range from about 0.1 to about 10 weight % by total solids of the antireflective coating composition, preferably from 0.3 to 5 weight % by solids, and more preferably 0.5 to 2.5 weight % by solids.

The novel composition may further comprise a second polymer. The second polymer can be one which also has carbon content greater than 75 weight %, or greater than 80 weight %. The second polymer may comprise a unit containing a fused aromatic ring, A, as described herein, a phenyl moiety, B, and a third unit selected from a substituted fused aromatic ring with greater than 2 aromatic rings. The third unit may be selected from a fused aromatic substituted with a hydroxy group. The third unit may be selected from hydroxyanthracyl moiety, hydroxyphenyl moiety, hydroxynaphthyl moiety, hydroxy pyrenyl moiety, $C_1$-$C_4$alkoxy anthracyl moiety, $C_1$-$C_4$ alkyl phenyl moiety, $C_1$-$C_4$ alkyl naphthyl moiety, $C_1$-$C_4$ alkyl pyrenyl moiety, etc. The third unit may be selected from hydroxyphenyl, hydroxynaphthyl, hydroxyphenanthryl, hydroxyanthracyl, etc. The third unit may be hydroxynaphthyl group. The second polymer may be added to the composition ranging from 1 weight % to 20% by weight of the total polymer concentration in the composition, or 1% to 10% by weight of the total polymer concentration. In one embodiment the second polymer is free of any aliphatic cyclic polycyclic groups. In another embodiment the second polymer is free of any aliphatic cyclic polycyclic groups and the third unit is a hydroxynaphthyl group.

In one embodiment the novel composition comprises the novel polymer, a second polymer described herein, a crosslinker, a thermal acid generator, optional surfactant and solvent(s). Another embodiment of the novel composition comprises the novel polymer, a crosslinker, a thermal acid generator, optional surfactant and solvent(s).

The solid components of the antireflection coating composition are mixed with a solvent or mixtures of solvents that dissolve the solid components of the antireflective coating. Suitable solvents for the antireflective coating composition may include, for example, a glycol ether derivative such as ethyl cellosolve, methyl cellosolve, propylene glycol monomethyl ether, diethylene glycol monomethyl ether, diethylene glycol monoethyl ether, dipropylene glycol dimethyl ether, propylene glycol n-propyl ether, or diethylene glycol dimethyl ether; a glycol ether ester derivative such as ethyl cellosolve acetate, methyl cellosolve acetate, or propylene glycol monomethyl ether acetate; carboxylates such as ethyl acetate, n-butyl acetate and amyl acetate; carboxylates of di-basic acids such as diethyloxylate and diethylmalonate; dicarboxylates of glycols such as ethylene glycol diacetate and propylene glycol diacetate; and hydroxy carboxylates such as methyl lactate, ethyl lactate, ethyl glycolate, and ethyl-3-hydroxy propionate; a ketone ester such as methyl pyruvate or ethyl pyruvate; an alkoxycarboxylic acid ester such as methyl 3-methoxypropionate, ethyl 3-ethoxypropionate, ethyl 2-hydroxy-2-methylpropionate, or methylethoxypropionate; a ketone derivative such as methyl ethyl ketone, acetyl acetone, cyclopentanone, cyclohexanone or 2-heptanone; a ketone ether derivative such as diacetone alcohol methyl ether; a ketone alcohol derivative such as acetol or diacetone alcohol; lactones such as butyrolactone; an amide derivative such as dimethylacetamide or dimethylformamide, anisole, and mixtures thereof.

The antireflective coating composition may comprise other components to enhance the performance of the coating, e.g. monomeric dyes, lower alcohols ($C_1$-$C_6$ alcohols), surface leveling agents, adhesion promoters, antifoaming agents, etc.

Since the antireflective film is coated on top of the substrate and is also subjected to dry etching, it is envisioned that the film is of sufficiently low metal ion level and of sufficient purity that the properties of the semiconductor device are not adversely affected. Treatments such as passing a solution of the polymer through an ion exchange column, filtration, and extraction processes can be used to reduce the concentration of metal ions and to reduce particles.

The absorption parameter (k) of the novel composition ranges from about 0.05 to about 1.0, preferably from about 0.1 to about 0.8 at the exposure wavelength, as derived from ellipsometric measurements. In one embodiment the composition has a k value in the range of about 0.2 to about 0.5 at the exposure wavelength. The refractive index (n) of the antireflective coating is also optimized and can range from about 1.3 to about 2.0, preferably 1.5 to about 1.8. The n and k values for the polymer or the composition can be calculated using an ellipsometer, such as the J. A. Woollam WVASE VU-32™ Ellipsometer. The exact values of the optimum ranges for k and n are dependent on the exposure wavelength used and the type of application. Typically for 193 nm the preferred range for k is about 0.05 to about 0.75, and for 248 nm the preferred range for k is about 0.15 to about 0.8. The carbon content of the novel antireflective coating composition is greater than 80 weight % or greater than 85 weight % as measured by elemental analysis of the dried film made from the composition. The carbon content of the film derived from the composition is maintained at a level of 80 weight % or greater than 80 weight % even after the film from the novel composition has been heated to temperatures up to 400° C. for up to 120 seconds.

The antireflective coating composition is coated on the substrate using techniques well known to those skilled in the art, such as dipping, spin coating or spraying. The film thickness of the antireflective coating ranges from about 15 nm to about 400 nm. The coating is further heated on a hot plate or convection oven for a sufficient length of time to remove any residual solvent and induce crosslinking, and thus insolubilizing the antireflective coating to prevent intermixing between the antireflective coating and the layer to be coated above it. The preferred range of temperature is from about 90° C. to about 280° C.

Other types of antireflective coatings may be coated above the coating of the present invention. Typically, an antireflective coating which has a high resistance to oxygen etching, such as one comprising silicon groups, such as siloxane, functionalized siloxanes, silsesquioxanes, or other moieties that reduce the rate of etching, etc., is used so that the coating can act as a hard mask for pattern transference. The silicon coating can be spin coatable or chemical vapor deposited. In one embodiment the substrate is coated with a first film of the novel composition of the present invention and a second coating of another antireflective coating comprising silicon is coated above the first film. The second coating can have an absorption (k) value in the range of about 0.05 and 0.5. A film of photoresist is then coated over the second coating. The imaging process is exemplified in FIG. 1. A film of photoresist is coated on top of the uppermost antireflective coating and baked to substantially remove the photoresist solvent. An edge bead remover may be applied after the coating steps to clean the edges of the substrate using processes well known in the art.

The substrates over which the antireflective coatings are formed can be any of those typically used in the semiconductor industry. Suitable substrates include, without limitation, low dielectric constant materials, silicon, silicon substrate coated with a metal surface, copper coated silicon wafer, copper, aluminum, polymeric resins, silicon dioxide, metals, doped silicon dioxide, silicon nitride, tantalum, polysilicon, ceramics, aluminum/copper mixtures; gallium arsenide and other such Group III/V compounds. The substrate may comprise any number of layers made from the materials described above.

Photoresists can be any of the types used in the semiconductor industry, provided the photoactive compound in the photoresist and the antireflective coating substantially absorb at the exposure wavelength used for the imaging process.

To date, there are several major deep ultraviolet (uv) exposure technologies that have provided significant advancement in miniaturization, and these radiation of 248 nm, 193 nm, 157 and 13.5 nm. Photoresists for 248 nm have typically been based on substituted polyhydroxystyrene and its copolymers/onium salts, such as those described in U.S. Pat. Nos. 4,491,628 and 5,350,660. On the other hand, photoresists for exposure at 193 nm and 157 nm require non-aromatic polymers since aromatics are opaque at this wavelength. U.S. Pat. Nos. 5,843,624 and 6,866,984 disclose photoresists useful for 193 nm exposure. Generally, polymers containing alicyclic hydrocarbons are used for photoresists for exposure below 200 nm. Alicyclic hydrocarbons are incorporated into the polymer for many reasons, primarily since they have relatively high carbon to hydrogen ratios which improve etch resistance, they also provide transparency at low wavelengths and they have relatively high glass transition temperatures. U.S. Pat. No. 5,843,624 discloses polymers for photoresist that are obtained by free radical polymerization of maleic anhydride and unsaturated cyclic monomers. Any of the known types of 193 nm photoresists may be used, such as those described in U.S. Pat. Nos. 6,447,980 and 6,723,488, and incorporated herein by reference. Two basic classes of photoresists sensitive at 157 nm, and based on fluorinated polymers with pendant fluoroalcohol groups, are known to be substantially transparent at that wavelength. One class of 157 nm fluoroalcohol photoresists is derived from polymers containing groups such as fluorinated-norbornenes, and are homopolymerized or copolymerized with other transparent monomers such as tetrafluoroethylene (U.S. Pat. Nos. 6,790,587, and 6,849,377) using either metal catalyzed or radical polymerization. Generally, these materials give higher absorbencies but have good plasma etch resistance due to their high alicyclic content. More recently, a class of 157 nm fluoroalcohol polymers was described in which the polymer backbone is derived from the cyclopolymerization of an asymmetrical diene such as 1,1,2,3,3-pentafluoro-4-trifluoromethyl-4-hydroxy-1,6-heptadiene (U.S. Pat. No. 6,818,258) or copolymerization of a fluorodiene with an olefin (U.S. Pat. No. 6,916,590). These materials give acceptable absorbance at 157 nm, but due to their lower alicyclic content as compared to the fluoro-norbornene polymer, have lower plasma etch resistance. These two classes of polymers can often be blended to provide a balance between the high etch resistance of the first polymer type and the high transparency at 157 nm of the second polymer type. Photoresists that absorb extreme ultraviolet radiation (EUV) of 13.5 nm are also useful and are known in the art. The novel coatings can also be used in nanoimprinting and e-beam lithography.

After the coating process, the photoresist is imagewise exposed with a mask. The exposure may be done using typical exposure equipment. Examples of exposure wavelength sources are 248 nm and 193 nm, although any source may be used. The exposed photoresist is then developed in an aqueous developer to remove the treated photoresist. The developer is preferably an aqueous alkaline solution comprising, for example, tetramethyl ammonium hydroxide (TMAH). Example of a developer is 0.26N aqueous tetramethyl ammonium hydroxide (TMAH) solution. The developer may further comprise surfactant(s). An optional heating step can be incorporated into the process prior to development and after exposure.

The process of coating and imaging photoresists is well known to those skilled in the art and is optimized for the specific type of photoresist used. The patterned substrate can then be dry etched with an etching gas or mixture of gases, in a suitable etch chamber to remove the exposed portions of the antireflective film or multiple layers of antireflective coatings, with the remaining photoresist acting as an etch mask. Various etching gases are known in the art for etching organic antireflective coatings, such as those comprising $O_2$, $CF_4$, $CHF_3$, $Cl_2$, HBr, $SO_2$, CO, etc.

Each of the documents referred to above are incorporated herein by reference in its entirety, for all purposes. The following specific examples will provide detailed illustrations of the methods of producing and utilizing compositions of the present invention. These examples are not intended, however, to limit or restrict the scope of the invention in any way and should not be construed as providing conditions, parameters or values which must be utilized exclusively in order to practice the present invention.

EXAMPLES

The refractive index (n) and the absorption (k) values of the carbon hard mask antireflective coating in the Examples below were measured on a J. A. Woollam VASE32 ellipsometer.

The molecular weight of the polymers was measured on a Gel Permeation Chromatograph.

Example 1

Synthesis of Copolymer of
2-phenylphenol/divinylbenzene/a-anthracenemethanol

A solution was prepared consisting of 12.76 g (0.075 mol) 2-phenylphenol, 15.62 g (0.075 mol) 9-Anthracene Methanol, 9.76 (0.075 mol) divinylbenzene dissolved in 25 g cyclopepentyl methyl ether (CPME) and 90 g diethylelene glycol dimethyl ether (DEGME) and the mixture was stirred for 5 minutes in a 250 mL, 4 neck flask equipped with an overhead mechanical stirrer, condenser, thermo watch, Dean Stark trap and an $N_2$ purge. After this time, 1.14 g of triflic acid (3% wt of monomers) was added to the stirred mixture and it was stirred for another 5 minutes. The temperature of the stirred mixture was then raised to 140° C. and heated for 3 hours. After cooling the reaction mixture and diluting it with 250 mL of CPME, it was transferred to a separatory funnel, and it was washed with two aliquots of deionised (DI) water (2×200 mL). The polymer was precipitated by drowning into hexane. The polymer was filtered, washed and dried. The polymer was dissolved in THF and isolated using hexane two additional times to remove all monomer and oligomers. This process yielded 40% finished polymer from the starting materials. The weight average molecular weight of the polymer was 1,859 with a polydispersity of 1.40.

Example 2

Processing

The polymer of Example 1 was dissolved in PGMEA as a 7% wt solution. This solution was filtered through a 0.2 μm PTFE filter and the solution was applied to silicon water and spun at 1,500 rpm to form a 200 micron thick polymer film. The coating quality of this polymer from a spin casting solvent was good with no visible defects present. Prior to post-applied bake (PAB), the coating passed an edgebead removal (EBR) test with PGMEA showing clean removal of polymer at the water's edge where the PGMEA solvent was applied. After PAB (230° or 400° C.), the coatings passed a soak tests with PGMEA solvent showing no visible sign of any film thickness loss. After PAB processing at different temperatures the polymer showed the following elemental composition.

|     | 230° bake | 400° bake |
| --- | --- | --- |
| % C | 89.64 | 80.88 |
| % H | 5.92 | 3.72 |
| % O | 2.82 | 8.72 |

With a PAB of 250° C. this polymer coating gave n=1.47 and k=0.68 Six additional batches were made of this material including one which was scaled up tenfold. All polymers had similar properties as described above in examples 1 and 2. Having very good solubility in PGMEA this polymer showed no tendency to form precipitates in the spin bowl.

Example 3

Synthesis of Co Polymer of
2-phenylphenol/divinylbenzene/a-anthracenemethanol

Using the same setup as described for Example 1, 8.50 g (0.06 mol) 2-phenylphenol, 30.34 g(0.15 mol) 9-anthracene methanol, 13.0 g (0.10 mol) divinylbenzene, 45 g CPME and 160 g DEGME were used. As in Example 1, after stirring this solution for 5 minutes, 1.55 g (3% wt of monomers) triflic acid was added and the reaction was stirred for another 5 minutes. As in example 1, the reaction temperature was increased to 140° C. and heated for 5 hours. After cooling the reaction mixture and diluting it with 250 mL of CPME, it was transferred to a separatory funnel, and it was washed with two aliquots of DI water (2×200 mL). The polymer was then precipitated into hexane. The polymer was then washed with hexane, air dried by suction and finally dried in a vacuum oven overnight. This process yielded 45% finished polymer from the starting materials. The weight average molecular weight of the polymer was 1,727 with a polydispersity of 1.53.

Example 4

Processing

Spin casting solution and film preparations were done as in Example 2 using instead the Polymer of Example 3 and a 70/30 mixture of PGMEA/cyclohexanone (CHN) as the spin casting solvent. A 200 micron thick film resulted after spinning. The coating quality of this polymer from a spin casting solvent was good with no visible defects present. Prior to post-applied bake (PAB) the coating passed an EBR test with PGMEA showing clean removal of polymer at the wafer's edge where the PGMEA was applied. After PAB (230° C. or 400° C.), the coating passed soak tests with PGMEA showing no visible sign of any film thickness loss. The polymer was completely soluble in a 70/30 mixture of PGMEA/CHN. After PAB processing at different temperatures the polymer showed the following elemental composition:

|     | 230° C. bake | 400° C. bake |
| --- | --- | --- |
| % C | 89.72 | 82.16 |
| % H | 5.75  | 3.76  |
| % O | 2.43  | 8.79  |

With a PAB of 230° C. this polymer showed n=1.47 and k=0.62

Example 5

Synthesis

Using the same setup as described for Example1, 8.50 g (0.06 mol) 2-phenylphenol, 17.3 g (0.083 mol) 9-anthracene methanol, 8.68 g (0.067 mol) divinylbenzene, 25 g CPME and 90 g DEGME were mixed. The synthesis was repeated as in Example 1. This process yielded 45% finished polymer from the starting materials. The weight average molecular weight of the polymer was 1,745 with a polydispersity of 1.45.

Example 6

Processing

Spin casting solution and film preparations were done as in Example 2 using instead the Polymer of Example 5 and a 90/10 mixture of PGMEA/CHN as the spinning solvent. A 200 micron thick film resulted after spinning. The coating quality of this polymer from a spin casting solvent was good with no visible defects present. Prior to post-applied bake (PAB) the coating passed an EBR test with PGMEA showing clean removal of polymer at the wafer's edge where the PGMEA was applied. After PAB (230° C. or 400° C.), the coating passed soak tests with PGMEA showing no visible sign of any film thickness loss. The polymer was completely soluble in a 90/10 mixture of PGMEA/CHN. After PAB processing at different temperatures the polymer showed the following elemental composition:

|     | 230° C. bake | 400° C. bake |
| --- | --- | --- |
| % C | 89.34 | 80.75 |
| % H | 5.69  | 3.27  |
| % O | 1.96  | 7.54  |

With a PAB of 250° C. this polymer coating showed n=1.47 and k=0.66.

Comparative Example 7

Synthesis of Co Polymer of m-cresol/divinylbenzene/9-anthracenemethanol

Using the same setup as described for Example1, 10.8 g (0.10 mol) m-cresol, 20.8 g (0.10 mol) 9-anthracene methanol, 13.0 g (0.1 mol) divinylbenzene, 32 g CPME and 115 g DEGME were mixed. As in Example 1, after stirring this solution for 5 minutes, 1.34 g(3% wt of monomers) triflic acid was added and the reaction was stirred for another 5 minutes. The synthesis was repeated as in example 1. This process yielded 40% finished polymer from the starting materials. The weight average molecular weight of the polymer was 6,748 with a polydispersity of 1.98

Comparative Example 8

Processing

Spin casting solution and film preparations were done as in Example 2 by using the polymer from Example 6 and PGMEA as the spinning solvent. A 200 micron thick film resulted after spinning. The coating quality of this polymer from a spin casting solvent was not good with many visible defects present. Although completely soluble in PGMEA, because of its poor film forming properties, this polymer could not be evaluated by the EBR test. After PAB (230° C. or 400° C.), it passed soak tests with PGMEA showing no visible sign of any film thickness loss. After PAB processing at different temperatures the polymer coating showed the following elemental composition:

|     | 230° C. bake | 400° C. bake |
| --- | --- | --- |
| % C | 86.51 | 76.77 |
| % H | 6.45  | 3.4   |

The poor film quality of spun films of this polymer precluded measuring n and k.

The polymer of example 6 which did not have the 2-phenyl phenol moiety of this invention and instead has a cresol moiety, did not coat as well as examples 1-3 which contain the 2-phenyl phenol moiety of this invention. Also, the carbon level of this material is much lower than any of the other examples that contain the 2-phenylphenol repeat unit, especially after a 400° C. bake.

Comparative Example 9

Synthesis of co polymer of [1,1'-biphenyl]-4,4'-diol/divinylbenzene/9-anthracenemethanol Using the same setup as described for Example 1, 8.50 g (0.05 mol) [1,1'-biphenyl]-4,4'-diol, 30.34 g (0.15 mol) 9-anthracene methanol, 13.0 g (0.10 mol) divinylbenzene, 45 g CPME and 160 g DEGME were mixed. The synthesis was repeated as in example 1. This process yielded 73% finished polymer from the starting materials. The weight average molecular weight of the polymer was 4,731 with a polydispersity of 2.44.

Comparative Example 10

Processing

Spin casting solution and film preparations were done as in Example 2 but using the polymer of Example 6 and PGMENCHN 70/30 as the spinning solvent. A 200 micron thick film resulted after spinning. The coating quality of this polymer from a spin casting solvent was good with no visible defects were present. The coating was completely soluble in PGMEA, and the polymer film passed the EBR test with PGMEA showing no residue at the wafer edge. After PAB (230° C. or 400° C.), the coating passed soak tests with PGMEA showing no visible sign of any film thickness loss. After PAB processing at different temperatures the polymer showed the following elemental composition:

|       | 230° C. bake | 400° C. bake |
|-------|--------------|--------------|
| % C   | 86.06        | 75.21        |
| % H   | 5.82         | 3.50         |
| % O   | 8.12         | 21.29        |

The polymer coating gave a lower carbon content than the inventive polymer, especially at 400° C.

Example 11

Etching

Blanket etch rates of the antireflective coatings were measured on a NE-5000 N (ULVAC) using both an oxidative (oxygen rich) and a fluorocarbon-rich etch condition outlined in Table 1. The antireflective coating films of formulations, from Examples 2, 4 and 6 with about 250 micron thickness were coated separately on 8" silicon wafers and baked at 230° C. for 1 minute. Individual film thickness measuring programs on a Nanospec 8000 using Cauchy's material-dependent constants derived by VASE analysis of the films and a 5 point inspection were performed before and after a 20 second etch. Etch rates were then calculated by taking the film thickness difference divided by etch times. The etch rate masking potential is shown in the etch rate data in Table 2 and Table 3. The results of the etch experiments show that the etch rate under both conditions are acceptable for processing.

TABLE 1

Etch conditions used in the blanket etch rate studies

| Etch condition    | Oxidative condition         | Fluorocarbon condition       |
|-------------------|-----------------------------|------------------------------|
| Gas               | $Cl_2/O_2/Ar$, 24/6/25 SCCM | $CF_4/O_2/Ar$, 50/20/150 SCCM |
| Process Pressure  | 1.6 Pa                      | 5 Pa                         |

Plate temperature: 20° C.;
RF power: 500 W with 50 W bias.

TABLE 2

Etch rate using Oxidative condition

| Formulation | Etch rate (A/min) |
|-------------|-------------------|
| Example 2   | 1086.00           |
| Example 4   | 1082.00           |
| Example 6   | 1092.00           |

TABLE 3

Etch rate using Fluorocarbon condition

| Formulation | Etch rate (A/min) |
|-------------|-------------------|
| Example 2   | 2839.00           |
| Example 4   | 2913.00           |
| Example 6   | 2958.00           |

Example 12

Synthesis of Poly[Pyrene/2-phenylphenol/divinylbenzene]

A solution was prepared consisting of 10.11 g (0.050 mol) pyrene, 8.51 g (0.050 mol) 2-phenylphenol, 6.50 g (0.050 mol) divinylbenzene, dissolved in a mixture of 145.3 g of diglyme and 29.33 g of CPME in a 250 ml, 4 neck RBF equipped with a overhead mechanical stirrer, a condenser, a thermo watch, a dean stark trap and a $N_2$ purge. The solution was stirred at room temperature for 10 minutes, after which time 1.36 g of trific acid (3% of the monomer) was added.

The reaction mixtures was stirred at room temp for another 5 minutes, and then its temperature was increased to 150° C. over the space of 30 minutes. The stirred reaction mixture was heated at 150° C. for 2½ hours, giving at total reaction time of 3 hours. Monitoring, by thin layer chromatography, indicated that the product was formed after this time, and consequently the heater was turned off and the reaction allowed to cool back to room temperature. Then, 40 ml of CPME was added and stirring was continued for 5 minutes after which time the reaction mixture was washed twice with de-ionized water. The reaction mixture was then precipitated into 1000 ml methanol, the polymer filtered, and then washed with fresh methanol and dried under vacuum at 85° C. overnight. The dried polymer was dissolved in 60 ml THF and precipitated into 1000 ml hexane. The final precipitate was filtered, washed with hexane and dried overnight under vacuum at 85° C.

Example 12 was repeated with different ratio of monomers and polymers were obtained. These examples 12-18 are shown in Table 4. Table 4 also lists the characterization data of these polymers, and their carbon and oxygen contents after different bake temperatures and times.

TABLE 4

|         | Molar feed ratio | Rxn  |      |       |      | %     | Solubility     | C,   | C, wt % |          | H, wt %  |          |
|---------|------------------|------|------|-------|------|-------|----------------|------|---------|----------|----------|----------|
| Example | Pyrene:DVB:2PP   | (hr) | Acid | Mw    | pdi  | Yield | (15% solid)    | wt % | 230/60 s | 400/120 s | 230/60 s | 400/120 s |
| 12      | 1:1:1            | 3    | 3    | 3343  | 1.88 | 53%   | PGMEA          | 90.09 | 88.85   | 77.35    | 5.84     | 3.29     |
| 13      | 1:1:0.5          | 3    | 3    | 21269 | 7.96 | 69%   | CHN            | 90.85 | 88.99   | 76.56    | 6.26     | 3.12     |
| 14      | 1:1:0.75         | 3    | 3    | 6367  | 2.62 | 69%   | PGMEA/CHN (90/10) | 90.14 | 88.88 | 76.77 | 5.86 | 3.22 |
| 15      | 1:0.5:0.5        | 3    | 3    | 2547  | 1.78 | 61%   | PGMEA/CHN (90/10) | 90.23 | 89.71 | 80.30 | 5.96 | 3.91 |
| 16      | 1:1:0.5          | 3    | 2    | 4503  | 2.42 | 63%   | CHN            | 91.23 | 90.18   | 76.56    | 6.02     | 3.04     |
| 17      | 1:0.75:0.75      | 3    | 3    | 4180  | 2.28 | 60%   | PGMEA/CHN (90/10) | 90.21 | 89.17 | 77.34 | 6.04 | 3.17 |
| 18      | 0.75:1:1         | 3    | 3    | 4843  | 2.22 | 52%   | PGMEA          | 89.50 | 88.09   | 76.86    | 6.05     | 3.53     |

Example 19

A solution was prepared consisting of 53.88 g (0.2665 mol) Pyrene, 8.51 g (0.1333 mol) 2-phenylphenol, 22.67 g (0.1424 mol) divinylbenzene, dissolved in a mixture of 304.04 g of diglyme and 61.36 g of CPME in a 4 neck RBF equipped with a overhead mechanical stirrer, a condenser, a thermo watch, a dean stark trap and a $N_2$ purge. The solution was stirred at room temperature for 10 minutes, after which time 2.85 g of trific acid (3% of the monomer) was added. The reaction mixtures was stirred at room temp for another 5 minutes, and then its temperature was increased to 145° C. over the space of 30 minutes. The stirred reaction mixture was heated at 145° C. for 3 hours, giving at total reaction time of 3.5 hours. Monitoring, by thin layer chromatography, indicated that the product was formed after this time, and consequently the heater was turned off and the reaction allowed to cool back to room temperature. Then, 200 ml of CPME was added and stirring was continued for 5 minutes after which time the reaction mixture was washed twice with de-ionized water. The reaction mixture was then precipitated into 1000 ml methanol, the polymer filtered, and then washed with fresh methanol and dried under vacuum at 85° C. overnight. The dried polymer was dissolved in 60 ml THF and precipitated into 3000 ml hexane. The final precipitate was filtered, washed with hexane and dried overnight under vacuum at 85° C.

Example 20

Processing

The polymer of Example 19 was dissolved in PGMEA/cyclohexanone 90/10 with crosslinker (TMOM-BP, 10 wt % to polymer) and thermal acid generator (DBSAIE, 4 wt % to polymer) as a 7% wt solution. This solution was filtered through a 0.2 urn PTFE filter and the solution was applied to silicon water and spun at 1,500 rpm to form a 200 micron thick polymer film. The coating quality of this polymer from a spin casting solvent was good with no visible defects present. Prior to post-applied bake (PAB), the coating passed an edge bead removal (EBR) test with PGMEA showing clean removal of polymer at the wafer's edge where the PGMEA solvent was applied. The coating composition after baking at 350° C./60 seconds gave a refractive index (n) at 193nm of 1.4786 and absorption (k) at 193 nm of 0.64409. After PAB (230° C. or 400° C.), the coatings passed a soak tests with PGMEA solvent showing no visible sign of any film thickness loss. After PAB processing at different temperatures the polymer showed the following elemental composition.

|      | 230° bake | 400° bake |
|------|-----------|-----------|
| % C  | 89.71     | 80.3      |
| % H  | 5.96      | 3.91      |

Example 21

Pattern Transfer Etching

FIG. 1 demonstrates the general procedure for generation of pattern transfer etch data to compare the etch performances between carbon underlayer formulations after pattern transfer etch. The etch conditions for each etch transfer step outlined in Table 4. To generate the multilayer stack as shown in FIG. 1, 200 nm FT of carbon underlayer was spin coated and baked at 350° C./180 sec on silicon substrate and then 31 nm FT of Si-BARC (S24H, available from AZ Electronic Materials, Somerville, N.J.) was spin coated and baked at 230° C./60 sec on the top the carbon underlayer. The AZ photoresist (AX2110P, available from AZ Electronic Materials, Somerville, N.J.) was coated on the top of Si-BARC layer. The spin speed was adjusted such that the photoresist film thickness was 125 nm, soft baked at 100° C./60 sec, exposed with Nikon 306D 0.85NA & 0.82/0.43 Dipole-Y Illumination using attenuated phase shift mask, then the wafer was post exposure baked at 110° C./60sec and developed using a 2.38 weight % aqueous solution of tetramethyl ammonium hydroxide for 30 sec. The stack was then dry etched using the conditions of Table 4 and the pattern was viewed on the scanning electron microscope SEM.

TABLE 4

Etch conditions used in the pattern transfer etch studies

| Etch Step | Etch Conditions | Etch Time |
|-----------|-----------------|-----------|
| Etch Transfer 1 | 10 Pa/500 w/250bot/20CF4/266 Pa He.BP/20 deg. Elect. temp | 10 sec |
| Etch Transfer 2 | 0.26 Pa/200 w/100bot/4O2/10N2/15Ar/266 Pa He.BP/20 deg. Elect. temp | 60 sec |
| Etch Transfer 3 | 10 Pa/500 w/250bot/20CF4/266 Pa He.BP/20 deg. Elect. temp | 10 sec |

Analysis of the pattern by SEM showed the pattern distortion (wiggling) caused by line expansion of underlayer during pattern transfer etch was significantly reduced and lithographically acceptable for this composition. Pattern transfer etch data demonstrated that etch performance of carbon underlayer polymer was improved by using pyrene in the composition in terms of good etch resistance and reduced wiggling of the pattern.

The invention claimed is:

1. A high carbon content antireflective coating composition comprising a crosslinker and a crosslinkable polymer, where the crosslinkable polymer comprises a unit represented by structure (1)

where A has structure (4) further where Ar is anthracene, B has a structure (2), and C is a hydroxybiphenyl of structure (3)

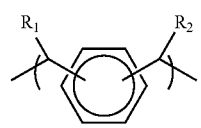

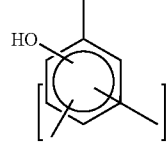

where $R_1$ is $C_1$-$C_4$alkyl and $R_2$ is $C_1$-$C_4$alkyl and further wherein, Ar may be unsubstituted or substituted with one or more organo constituents, chosen from the group consisting of alkyl, aryl, substituted aryl, alkylaryl, and haloalkyls, hydroxyl, amino, and aminoalkyl;

and further were the composition after coating, and baking at 400° C. for 120 seconds, has a carbon content that is greater than 80 weight%.

2. The composition of claim 1, where the polymer in the composition is free of aliphatic polycyclic moieties.

3. The composition of claim 1, where the polymer further comprises unit (5),

[—Ar'—] (5)

where Ar is a group with 2-8 fused aromatic ring.

4. The composition of claim 1, where $R_1$ is methyl and $R_2$ is methyl.

5. The composition of claim 1, where the composition further comprises an acid generator.

6. The composition of claim 1, where the composition further comprises a thermal acid generator.

7. The composition of claim 1 further comprising a surfactant.

8. The composition of claim 1 further comprising a second polymer.

9. The composition of claim 1 further comprising a second polymer, where the second polymer is free of aliphatic polycyclics.

10. The polymer of claim 1 having a carbon content of greater than 80 weight% by solid content.

11. The polymer of claim 1 where the repeat unit A is derived from the monomer 9-anthracenemethanol.

12. The composition according to claim 1 where the crosslinker is a compound that can act as an electrophile and can, alone or in the presence of an acid, form a carbocation.

13. The composition of claim 12 where the crosslinker is chosen from, polyfunctional reactive benzylic compounds, aminoplast crosslinkers,and glycolurils.

14. The composition of claim 12 where the crosslinker is chosen from 1,3 adamantane diol, 1,3,5 adamantane triol, and tetramethoxymethyl-bisphenol (TMOM-BP) of structure (18)

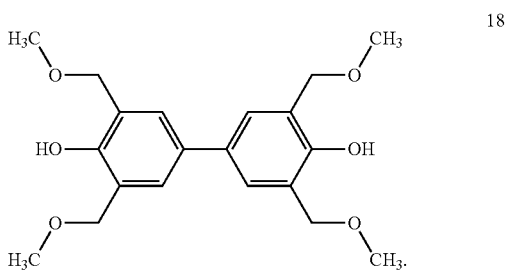 [SMILES: COCc1cc(-c2cc(COC)c(O)c(COC)c2)cc(COC)c1O]

15. A process for manufacturing a microelectronic device, comprising;
  a) providing a substrate with a first layer of an antireflective coating composition from claim 1;
  b) optionally, providing at least a second antireflective coating layer over the first antireflective coating composition layer;
  b) coating a photoresist layer above the antireflective coating layers;
  c) imagewise exposing the photoresist layer;
  d) developing the photoresist layer with an aqueous alkaline developing solution.

16. The process of claim 15, where the first antireflective coating layer has k value in the range of about 0.05 to about 1.0 at 193 nm.

17. The process of claim 15, where the second antireflective coating comprises silicon.

18. The process of claim 15, where the second antireflective coating layer has k value in the range of about 0.05 to about 0.5 at 193 nm.

19. The process of claim 15, where the photoresist is imageable with radiation from about 240 nm to about 12 nm.

20. The process according to claim 15, where the developing solution is an aqueous solution comprising a hydroxide base.

* * * * *